US011233013B2

(12) United States Patent
Lettens et al.

(10) Patent No.: US 11,233,013 B2
(45) Date of Patent: Jan. 25, 2022

(54) PROCESS VARIATION AS DIE LEVEL TRACEABILITY (71) Applicant: SEMICONDUCTOR COMPONENTS INDUSTRIES, LLC, Phoenix, AZ (US)

(72) Inventors: Jan Lucie Axel Lettens, Zwijnaarde (BE); Wim Dobbelaere, Ninove (BE); Bart Arthur Norbert De Leersnyder, Merelbeke (BE); Thomas Van Vossel, Laarne (BE)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/860,683

(22) Filed: Apr. 28, 2020

(65) Prior Publication Data
US 2020/0258844 A1 Aug. 13, 2020

Related U.S. Application Data (62) Division of application No. 16/114,674, filed on Aug. 28, 2018, now Pat. No. 10,685,918.

(51) Int. Cl.
*H01L 21/66* (2006.01)
*H01L 23/544* (2006.01)
(Continued)

(52) U.S. Cl.
CPC ............ *H01L 23/544* (2013.01); *H01L 22/14* (2013.01); *H01L 22/30* (2013.01); *H01L 22/34* (2013.01);
(Continued)

(58) Field of Classification Search
CPC ................ H01L 2223/5448; H01L 2223/5444
See application file for complete search history.

(56) References Cited

U.S. PATENT DOCUMENTS 6,161,052 A 12/2000 Charlton et al.
6,161,213 A 12/2000 Lofstrom
(Continued)

OTHER PUBLICATIONS

U.S. Appl. No. 15/949,762, Response to non-final Office Action, dated Jul. 9, 2020.
(Continued)

*Primary Examiner* — Grant S Withers
(74) *Attorney, Agent, or Firm* — Wash Park IP Ltd.; John T. Kennedy (57) ABSTRACT

Devices, systems and methods for uniquely identifying integrated circuits are provided. For at least one embodiment, an identifiable integrated circuit in a lot of integrated circuits includes a plurality of identifier devices. Each of the identifier devices, when tested, returns a series of first test results that form an analog identifier for the integrated circuit. For one embodiment, the identifier devices is a Zener diode. The test results may be based on reverse breakdown voltage measurements determined prior to packaging of the integrated circuit. Later testing of the integrated circuit returns a second series of reverse breakdown voltage measurements that monotonically vary over time and temperature, as compared to the first series of test results. Such monotonical variation facilitates correlation of the first series of test results with the second series of test results and, thereby, identification of the integrated circuit.

19 Claims, 3 Drawing Sheets (51) Int. Cl.
*H01L 29/66* (2006.01)
*H01L 27/08* (2006.01)
*H01L 29/866* (2006.01)

(52) U.S. Cl.
CPC .... *H01L 27/0814* (2013.01); *H01L 29/66106* (2013.01); *H01L 29/866* (2013.01); *H01L 2223/5444* (2013.01); *H01L 2223/5448* (2013.01)

(56) References Cited

U.S. PATENT DOCUMENTS

| | | | |
|---|---|---|---|
| 7,812,595 | B2 | 10/2010 | Okayasu et al. |
| 8,417,754 | B2 | 4/2013 | Potkonjak et al. |
| 9,864,006 | B1 | 1/2018 | Erickson et al. |
| 2002/0152043 | A1 | 10/2002 | Skidmore |
| 2003/0062609 | A1 | 4/2003 | Funatsu |
| 2003/0160715 | A1* | 8/2003 | Maeda ............... H04W 12/1206 341/144 |
| 2004/0006404 | A1 | 1/2004 | McAdams et al. |
| 2004/0124437 | A1 | 7/2004 | Doudoumopolous |
| 2005/0042780 | A1 | 2/2005 | Matsunami |
| 2005/0283266 | A1 | 12/2005 | Geraci et al. |
| 2006/0063286 | A1 | 3/2006 | Bidermann et al. |
| 2008/0028349 | A1 | 1/2008 | Muranaka |
| 2008/0052029 | A1 | 2/2008 | Benware et al. |
| 2009/0133867 | A1 | 5/2009 | Kuckes |
| 2009/0243792 | A1 | 10/2009 | Chmelar |
| 2013/0006564 | A1 | 1/2013 | Chavet et al. |
| 2014/0061952 | A1 | 3/2014 | Rampley et al. |
| 2016/0211232 | A1 | 7/2016 | Choi et al. |
| 2016/0351508 | A1 | 12/2016 | Kalyanaraman et al. |
| 2017/0243831 | A1 | 8/2017 | Butler et al. |

OTHER PUBLICATIONS

U.S. Appl. No. 16/112,221, non-final Office Action, dated Jul. 21, 2020.
Gassend et al., "Identification and Authentication of Integrated Circuits", "Concurrency and Computation: Practice and Experience", 2004, pp. 1077-1098, vol. 2004, No. 16, Publisher: John Wiley & Sons Ltd, Published in: USA.
Su et al., "A Digital 1.6pJ/Bit Chip Identification Circuit Using Process Variations", "IEEE Journal of Solid-State Circuits", Jan. 1, 2008, pp. 69-77, vol. 43, No. 1, Publisher: IEEE, Published in: USA.

* cited by examiner

PROCESS VARIATION AS DIE LEVEL TRACEABILITY

CROSS REFERENCE TO RELATED APPLICATIONS

The present application claims priority to and is a Divisional application of U.S. patent application Ser. No. 16/114,674, filed on Aug. 28, 2018, in the name of inventors Jan Lucie Axel Lettens, Wim Dobbelaere, Bart Arthur Norbert De Leersnyder, and Thomas Van Vossel, and entitled "Process Variation as Die Level Traceability," the entire contents of which are incorporated herein by reference.

TECHNICAL FIELD

The technology described herein generally relates to methods for uniquely identifying integrated circuits (ICs). More specifically the technology described herein uses random IC-to-IC variations, which occur during fabrication of otherwise identically designed integrated circuits, to distinguish one integrated circuit from another. In particular, the technology described herein relates to the use of Zener diodes to provide analog identifiers for use in identifying integrated circuits. The technology described herein also relates to devices and systems identified using an analog identifier determined during fabrication of an integrated circuit.

BACKGROUND

As is commonly known and appreciated, integrated circuits are commonly fabricated using one or more process steps. Such process steps are often executed in lots. The lots commonly contain multiple wafers, with each wafer containing multiple integrated circuits. Commonly, individual integrated circuits can be identified during fabrication based on their position on a wafer, for a given lot. Commonly an X-Y coordinate system is used for identifying the portion of the wafer, the portion often being referred to as an integrated circuit. Such coordinate system can be used during fabrication and before cutting of the wafer into individual integrated circuits. For example, a given integrated circuit may be fabricated in lot "Q," on wafer "N," at X-coordinate "A" and Y-coordinate "B." Where each of Q, N, A and B are real numbers. Accordingly, during the fabrication process, the identification of individual integrated circuits can commonly be accomplished using a lot/wafer/integrated circuit identification scheme. Such identification scheme permits tracking of each integrated circuit, during fabrication, in a database or otherwise. However, during fabrication each wafer is eventually cut into separate integrated circuits, packaged, and then utilized as desired. The packaging for the integrated circuit commonly identifies the lot in which it was fabricated, but, does not identify the wafer or location thereon. Upon a wafer being cut and packaged, the traceability of a given integrated circuit can no longer be made simply based upon the lot/wafer/integrated circuit identification scheme. Instead, an additional identifier is commonly needed.

Further, integrated circuits are often fabricated in high volumes and used in applications where quality is vitally important. Examples of such applications include, but are not limited to, automotive electronics. While significant process controls are used to prevent and minimize the occurrence of defects during the fabrication of integrated circuits, due to the substantial number of circuits often fabricated, even rare problems, such as those measured in parts per million (ppm) and/or parts per billion (ppb) can be troublesome. Such concerns are further enhanced by the substantial number of such circuits utilized in automobiles and other implementations. Such uses often number in the hundreds of circuits per any given vehicle or other implementation. Given the volumes involved, such errors may result in substantial business, economic and other pressures being exerted on fabricators of such circuits. These concerns commonly result in increased efforts by fabricators, when defects do arise, to determine the root cause of the failure in order to satisfy a zero defects standard.

Yet, determining the root cause of a defect in an integrated circuit is inherently difficult. This difficulty is often due, at least in part, to a large number of possible failure modes which originate from the combination of a complex fabrication process with a complex circuit design. Additionally, to determine whether a solution actually overcomes a defect often results in substantial costs to manufacturers in terms of long cycles for improvements and a need to use numerous engineers to, as best as possible, definitively identify and implement corrective actions to prevent defects in integrated circuits. Therefore it is of major importance to have as much information as possible about the defective integrated circuit. If the integrated circuit is uniquely identifiable it becomes possible to access any previously stored information about the integrated circuit. This information can be used to apply statistical post-processing techniques, such as Part Average Testing, which is a commonly known method to detect and remove statistical outliers during production testing.

Notably, numerous approaches have been proposed for uniquely identifying integrated circuits. These approaches have included the use of marks or designators on integrated circuits, packaging, or otherwise. Examples of such approaches are disclosed in Patent and/or Patent Application Publication Numbers US2017/0243831, US2003/0062609, EP2625708, US2016/0351508, US2005/0042780, US2014/0061952 and otherwise. Other approaches have included the use of additional circuit components such as memory components, certain discrete components such as resistors and capacitors, or non-discrete components such as transistors. Examples of such approaches are disclosed in Patent and/or Patent Application Publication Numbers U.S. Pat. Nos. 6,161,213, 6,941,536, US2004/0124437, US2004/0006404, and otherwise. Each of these known approaches, however, are insufficient for a variety of reasons including requiring additional process steps, requiring use of additional and substantial die space to provide the components used for die level tracing, providing only partial traceability, the identifier utilized being subject to tampering, change or copying, requiring the use of dedicated test equipment to trace a given integrated circuit, requiring the use of digital identifiers, and otherwise.

Accordingly, a need exists for providing die level traceability using natural process variations that arise during fabrication of integrated circuits, where such traceability does not require the use of additional process steps, or substantial die space, are tamper proof, and can be detected using commonly available test equipment and processes. Such needs are addressed by one or more of the embodiments of the present disclosure.

SUMMARY

The various embodiments of the present disclosure relate in general to devices, systems and methods for uniquely identifying integrated circuits. In accordance with at least one embodiment, a method for marking a given integrated circuit out of a plurality of integrated circuits may include the operations of fabricating a plurality of identifier devices onto each integrated circuit of the plurality of integrated circuits. The method may also include testing each of the plurality of identifier devices to obtain a test result for each identifier device. The method may also include associating together each test result obtained for each identifier device fabricated onto each given integrated circuit to form an analog identifier for the given integrated circuit. The method may also include storing in a database each analog identifier for each of the plurality of integrated circuits.

For a least one embodiment, a method for marking a given integrated circuit out of a plurality of integrated circuits may include use of a plurality of identifier devices that include Zener diodes. The method may include testing of each of the plurality of identifier devices by determining the reverse breakdown voltage for each of the Zener diodes. For at least one embodiment, at least ten Zener diodes may be used.

For a least one embodiment, a method for marking a given integrated circuit out of a plurality of integrated circuits may include determining the plurality of identifier devices needed to uniquely identify each integrated circuit of the plurality of integrated circuits from each of a remainder of the plurality of integrated circuits. For at least one embodiment, each analog identifier formed for each of the plurality of integrated circuits may uniquely correspond to a single given integrated circuit of the plurality of integrated circuits.

For a least one embodiment, a method for marking a given integrated circuit out of a plurality of integrated circuits may include associating at least one integrated circuit of the plurality of integrated circuits with an article of commerce. For at least one embodiment, each of the plurality of identifier devices may monotonically vary over at least one of time and temperature.

In accordance with at least one embodiment of the present disclosure, a method for identifying a subject integrated circuit from a plurality of integrated circuits is provided. For at least one embodiment, a method may include receiving a subject integrated circuit which is one of a plurality of integrated circuits manufactured in a given lot of integrated circuits. The subject integrated circuit includes a plurality of identifier devices. The method may include testing each of the plurality of identifier devices to obtain a resulting plurality of test results. The method may include associating the resulting plurality of test results to form a subject integrated circuit analog identifier.

The method for identifying a subject integrated circuit from a plurality of integrated circuits may include accessing a database containing a plurality of analog identifiers, wherein each analog identifier in the plurality of analog identifiers corresponds to a single given integrated circuit fabricated as one of the plurality of integrated circuits in the given lot of integrated circuits. The method may include comparing the subject integrated circuit analog identifier with the plurality of analog identifiers.

For at least one embodiment, a method for identifying a subject integrated circuit from a plurality of integrated circuits may include identifying, based on a correlation of the subject integrated circuit analog identifier with one of the plurality of analog identifiers, the subject integrated circuit as a single one of the plurality integrated circuits in the given lot of integrated circuits.

For at least one embodiment, a subject integrated circuit has been previously marked per a corresponding embodiment of a marking process described herein.

For at least one embodiment, the analog identifier of each of the plurality of integrated circuits may be used to perform Dynamic Part Average Testing (DPAT) on the plurality of integrated circuits for an electrical test insertion performed on packaged integrated circuits.

For at least one embodiment, each of the plurality of identifier devices is a Zener diode. The method for identifying a subject integrated circuit from a plurality of integrated circuits may include the operation of testing each of the plurality of identifier devices to determine the reverse breakdown voltage for each of the Zener diodes. The method may include the operation of comparing the subject integrated circuit analog identifier with the plurality of analog identifiers and determining a correlation coefficient between the subject integrated circuit analog identifiers and each of the plurality of analog identifiers. For at least one embodiment, the correlation coefficient may be based on a Pearson correlation.

For at least one embodiment, a method for identifying a subject integrated circuit from a plurality of integrated circuits may include identifying a subject integrated circuit when a correlation coefficient of the subject integrated circuit analog identifier compared to a given one of the plurality of analog identifiers is substantially 1.0. For at least one embodiment, the identifying occurs when the correlation coefficient of the subject integrated circuit analog identifier compared to a given one of the plurality of analog identifiers is between 0.9 and 1.0. For at least one embodiment, each of the plurality of identifier devices monotonically varies over at least one of time and temperature.

In accordance with at least one embodiment of the present disclosure, an identifiable integrated circuit includes, on each integrated circuit in a lot of integrated circuits, a plurality of identifier devices. For at least one embodiment, each of the plurality of identifier devices, when tested, returns a series of first test results. For at least one embodiment, the series of first test results collectively form a first analog identifier for the integrated circuit. Each of the plurality of identifier devices may include a Zener diode. The series of first test results may arise from use of Automated Test Equipment testing. Such testing may include testing of a reverse breakdown voltage for each of the plurality of identifier devices. Such testing may occur before packaging of the integrated circuit. A first analog identifier may be saved for later use in identifying an integrated circuit. A second, later use of the Automated Test Equipment testing may include testing of the reverse breakdown voltage for each of the plurality of identifier devices. Such testing may return a second series of test results, forming a second analog identifier. The second series of test results may monotonically vary over time and temperature versus the first series of test results. A correlation between the first series of test results and the second series of test results may be used to correlate the first analog identifier to the second analog identifier.

BRIEF DESCRIPTION OF THE DRAWINGS

The features, aspects, advantages, functions, modules, and components of the devices, systems and methods provided by the various embodiments of the present disclosure are further disclosed herein regarding at least one of the following descriptions and accompanying drawing figures.

DETAILED DESCRIPTION

The various embodiments described herein are directed to methods for uniquely identifying an integrated circuit by associating it with an analog identifier. In accordance with at least one embodiment, the analog identifier is stable and may be determined during fabrication, post-fabrication testing, and after in-field use of the integrated circuit. In accordance with at least one embodiment, the analog identifier may be determined based upon characteristics of one or more discrete components (herein, each an "identifier device"). In accordance with at least one embodiment, measured device characteristics may correspond to a specific batch, lot, wafer, integrated circuit or otherwise utilized to fabricate a given integrated circuit. In accordance with at least one embodiment, measured characteristics of one or more identifier devices, such as Zener diodes, may be utilized to provide an analog identifier for a given integrated circuit. In accordance with at least one embodiment of the present disclosure, a plurality of Zener diodes can be utilized to uniquely identify an integrated circuit. In accordance with at least one embodiment of the present disclosure an analog identifier may be based upon a given characteristic of an identifier device, such as a reverse breakdown voltage of a Zener diode. Per at least one embodiment, a collection of Zener diodes can be fabricated onto each integrated circuit used to form each integrated circuit, such that the responsive characteristics of each such collection of Zener diodes can be used to form a unique identifier of a given integrated circuit. Such identifier effectively functions as a fingerprint for the integrated circuit (an "IC Fingerprint"). Per at least one embodiment, the Zener diodes used to provide the functionality of a given integrated circuit may be used, in whole or in part, to identify the integrated circuit. Per at least one embodiment the Zener diodes may be added to the integrated circuit to provide a unique analog identifier providing an IC Fingerprint.

In accordance with the development of the inventive concepts of the present disclosure, the use of Zener diodes to provide such IC Fingerprinting has arisen from the novel and non-obvious discovery that one or more identifier devices, such as Zener diodes, can be fabricated on the same integrated circuit and tested using the same processes during each of fabrication, testing, post-wafer cutting, and use to identify a given integrated circuit. More specifically, this can be achieved by basing an analog identifier upon one or more characteristics of an identifier device, such as the reverse breakdown voltage for a Zener diode. It is to be appreciated, that other types of identifier devices and/or characteristics may be used to generate an IC Fingerprint.

For at least one embodiment where Zener diodes are utilized, one characteristic of a collection of Zener diodes is that their reverse breakdown voltages vary monotonically over both time and temperature. Such device characteristic provides a stable analog identifier for each Zener diode, and when combined, as per at least one embodiment of the present disclosure, collectively provide an IC Fingerprint that is stable over time. This stability arises, at least in part, because each reverse breakdown voltage arising in a given collection of Zener diodes drifts monotonically. As a result, the relative differences between the reverse bias voltages of the Zener diodes remain the same over time and temperature and such relative differences arising over the collection of Zener diodes can be used to provide an IC fingerprint. More specifically, the measured characteristics of a collection of Zener diodes can be correlated with prior measured characteristics for a given integrated circuit, thereby facilitating later identification of the integrated circuit. Such prior and/or later measured characteristics of an integrated circuit marked using one or more monotonically behaving devices may be determined at any time, such as during fabrication, test, use or otherwise of the given integrated circuit.

Secondly and for at least one embodiment, a device characteristic may be used which can be measured both accurately and precisely with Automated Test Equipment. Such a device characteristic provides a basis for an analog identifier where even when small variations between devices, and by extension analog identifiers, are identifiable. For at least one embodiment, the reverse breakdown voltage of a Zener diode provides one such device characteristic. Other devices and/or characteristics thereof may be used in accordance with one or more embodiments of the present disclosure.

Third and for at least one embodiment, an analog identifier may be utilized. It is to be appreciated an analog identifier facilitates retention of a vast quantity of information about a device, such as a Zener diode, used to provide an IC Fingerprint. In contrast, when a low bit count digital representation of such information is utilized, information about such an identifier device may be lost or otherwise not retained.

Fourth, it is to be appreciated that the various embodiments of the present disclosure provide various improvements over known solutions. For example, by using Zener diodes as one or more identifier devices it is possible to limit the extra area, if at all necessary, used to identify a given integrated circuit. Partly, such savings may be realized because the Zener diode is often comparatively small in size and/or is commonly used in integrated circuits. When commonly used, only a few or even no extra Zener diodes (i.e., identifier devices) may need to be added to provide an IC Fingerprint.

Further, it is to be appreciated that only a small (often 20 or less) number of Zener diodes may be needed to provide an IC Fingerprint. This saving in the number of identifier devices utilized may arise in view of the accuracy and precision of a Zener diode's device characteristics, and the degree to which one such device characteristic varies from Zener diode to Zener diode. Such variations may be determined using Automated Test Equipment and may be upon analog information including, but not limited to, an exponential current-voltage behavior common to Zener diodes.

Further, it is to be appreciated that the use of Zener diodes to provide die level traceability, as per one or more embodiments of the present disclosure, is not contemplated by the prior art where devices, such as resistors, capacitors, transistors or otherwise are contemplated. Instead, it is to be appreciated that per the present disclosure, that while Zener diode device characteristics can vary over time and temperature and are perhaps less intrinsically sensitive to process variations, these disadvantages can be overcome. First of all, the variation of a collection of Zener diodes commonly occurs in a monotonic manner not affecting the relative characteristics of the collection. Secondly, the variation of the measurement of the reverse breakdown voltage of the Zener diode is negligible compared to the actual reverse breakdown voltage of the Zener diode. Accordingly, their use as an identifier of an integrated circuit is not contemplated by the prior art of record, as identified herein. Accordingly, it is to be appreciated that the use of Zener diodes, as per at least one embodiment of the present disclosure, is a fundamental departure from known approaches to identifying integrated circuits.

More specifically, in at least one embodiment of the present disclosure, Zener diodes provide integrated circuit device components whose device characteristics are measurable and unique from the perspective of one collection of Zener diodes to another collection of Zener diodes. These device characteristics facilitate the creation of an analog identifier for an integrated circuit, wherein the analog identifier is based upon at least one measured device characteristic for each of a plurality of Zener diodes provided in an integrated circuit. For at least one embodiment, an analog identifier for an integrated circuit may include a collection of a single measured device characteristic for each of a plurality of identifier devices, such as Zener diodes.

Further, it is to be appreciated that the Zener diodes used to identify a given integrated circuit may arise in the circuit itself or elsewhere on an integrated circuit, such as on the silicon substrate embodying such integrated circuit. Given the relatively small footprint of a Zener diode, any additional Zener diodes added to an integrated circuit to provide die level traceability for a given integrated circuit, as per at least one embodiment of the present disclosure, commonly results in an approach which utilizes an insubstantial area of an integrated circuit. As used herein an insubstantial use of an integrated circuit area, such as an integrated circuit occupying between 1 and 10 square millimeters of a substrate, is a use of less than 1% of the total available area provided by such substrate. A person of ordinary skill in the art will appreciate, however, that the relative use of portions of a given substrate will vary with the sizing of integrated circuits on such substrate, the number of identifier devices actually utilized to provide an IC Fingerprint, and other factors.

It is to be appreciated that the number of Zener diodes used to identify an integrated circuit may vary based upon a number of variables, such as the number of integrated circuits on a wafer, the number of wafers in a lot and the probability where one integrated circuit is mistakenly identified as another. Monte Carlo simulations and other known statistical approaches may be utilized to identify the number of Zener diodes, and/or other identifier devices, desired to uniquely identify an integrated circuit in a given lot. Further, it is to be appreciated that the number of devices used for a first collection of identifier devices may vary from the number used in a different or second collection of identifier devices. Such differences may vary based upon device characteristics used in any given collection of identifier devices to provide an IC Fingerprint. It is to be appreciated that the lot in which an integrated circuit is fabricated is commonly identified on the packaging of the integrated circuit.

Figure 1A:
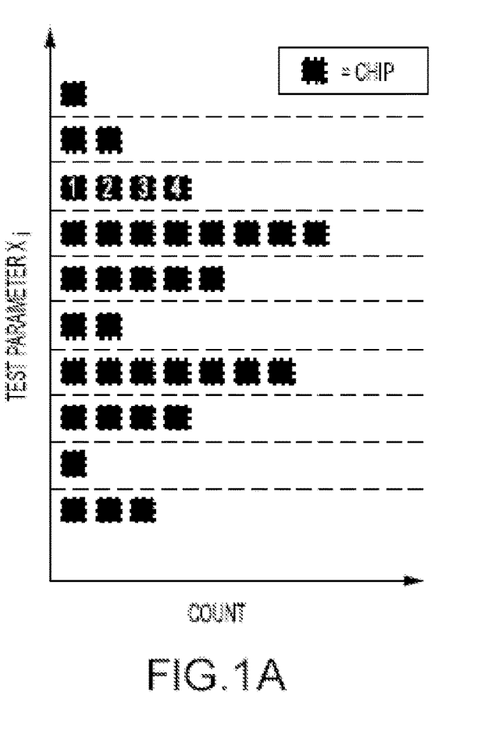
FIG. 1A is a histogram representing results achieved for a population of integrated circuits based on a first test and for use in conjunction with one or more embodiments of the present disclosure.
Figure 1B:
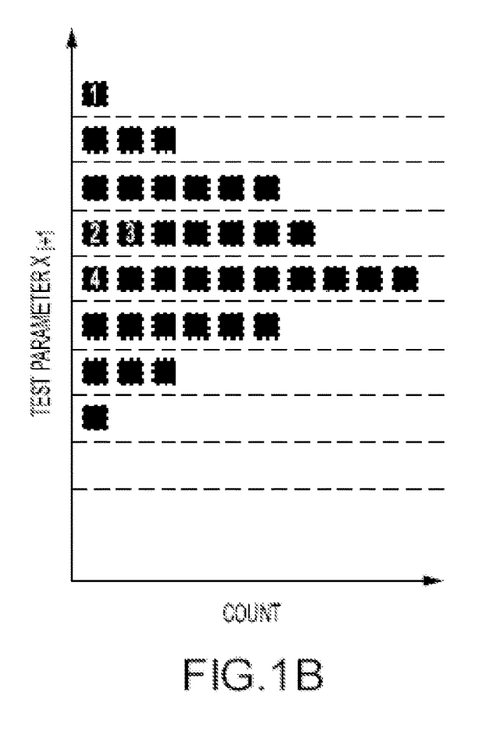
FIG. 1B is a is a histogram representing results achieved for a population of integrated circuits based on a second test and for use in conjunction with one or more embodiments of the present disclosure.

For example, as shown in FIG. 1A, a given collection of integrated circuits may be identified by testing Zener diodes fabricated thereon under a first test condition $X(i)$. As shown, each of integrated circuits 1, 2, 3 and 4 return a characteristic falling in a third (from top) result. Accordingly, integrated circuits 1-4 cannot be separately identified from each other based on the first test condition. As shown in FIG. 1B, a second test condition $X(i+1)$ may also be applied to the collection of integrated circuits. As shown, integrated circuit 1 returns a unique result (as falling alone in the top result), while integrated circuits 2, 3 and 4 share test results with other non-identified integrated circuits. Accordingly, based upon solely the second test condition, integrated circuits 2, 3 and 4 are not separately identifiable. However, when the results of the first test condition are viewed in combination with the results of the second test condition, each of integrated circuits 1 and 4 are separately identifiable, while integrated circuits 2 and 3 require further test conditions to be uniquely identifiable. Accordingly, it is to be appreciated that by use of a number of Zener diodes and/or test conditions, an integrated circuit may be uniquely identified from other integrated circuits in a lot based upon test results measured during fabrication and later during use, wherein the same tests are used at both stages.

Figure 2:
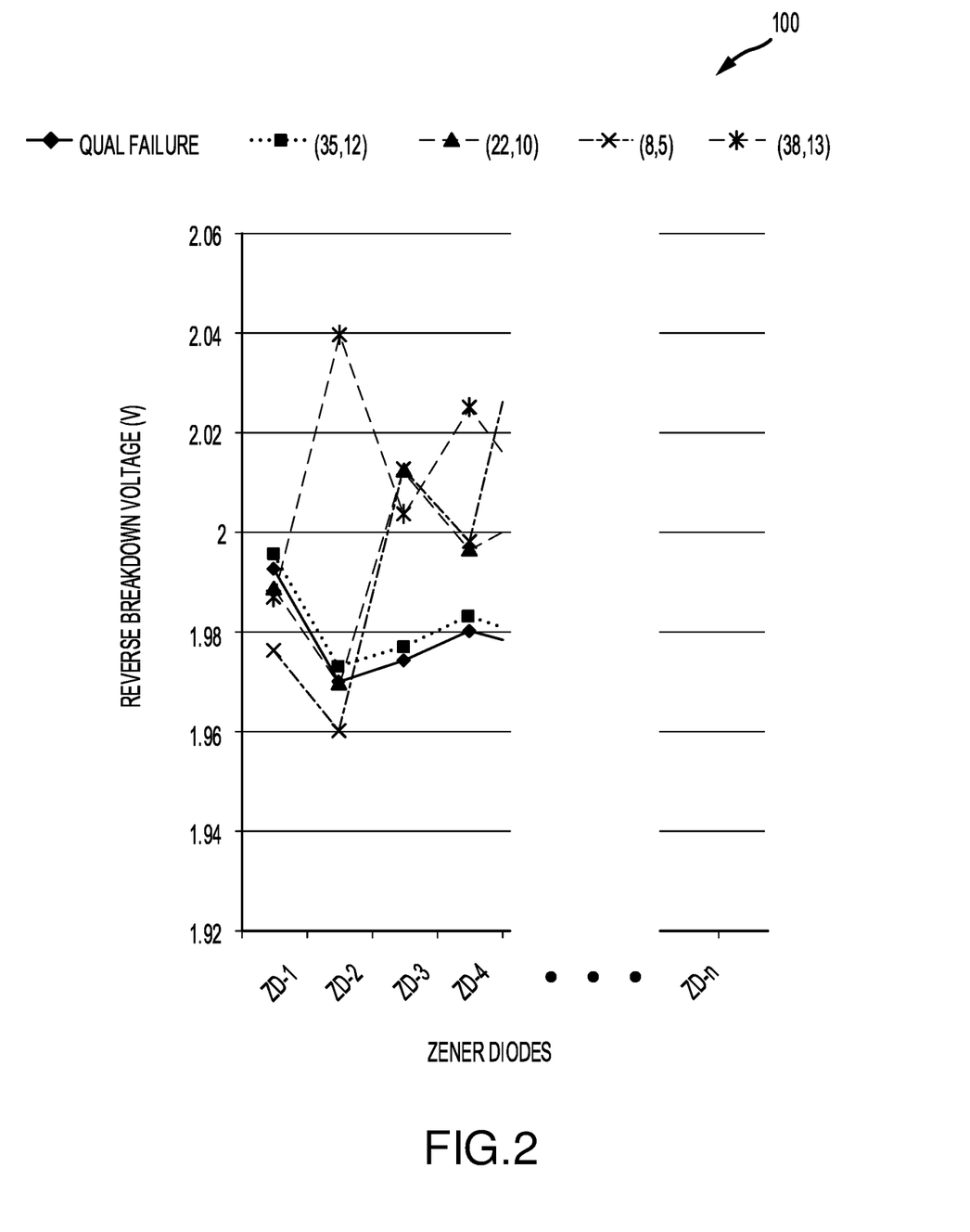
FIG. 2 is a line chart representing test results achieved for various integrated circuits and numerous Zener diodes and for use in accordance with at least one embodiment of the present disclosure to generate and/or identify an analog identifier for a given integrated circuit.

More specifically shown in FIG. 2, a number of integrated circuits 100 may each include a number of Zener diodes (identified as ZD-1, ZD-2 . . . ZD-n). Each Zener diode is desirably the same on each integrated circuit, but, subtle variations in such device during fabrication will occur. Accordingly, each integrated circuit will exhibit a reverse breakdown voltage for that Zener diode that will be different and that will be distinguishable from another on a certain scale. As shown, for the ZD-1 results, an integrated circuit (35,12) (where 35 is the X-coordinate and 12 is the Y-coordinate on a given wafer) may not be easily distinguished from one or more other integrated circuits, such as (22,10), (8,5), (38,13), on a given wafer. However, when based upon the combination of multiple Zener diode results, each integrated circuit may be uniquely identified. That is, a combination of test results measured across a combination of Zener diodes formed on a given integrated circuit can be used, per at least one embodiment of the present disclosure, to provide a unique analog identifier for that integrated circuit. The unique analog identifier functions essentially as an IC Fingerprint where a plurality of data values, for unique devices (e.g., Zener diodes), at unique integrated circuit locations, are used for identification purposes. Accordingly, for the various embodiments of the present disclosure, a plurality of reverse breakdown voltages, each associated with a unique Zener diode, form an IC Fingerprint of the integrated circuit. Accordingly, per at least one embodiment of the present disclosure, an analog identifier of a given integrated circuit is provided.

It is to be appreciated that this analog identifier can be obtained at any time during the fabrication and/or testing process while the specific coordinate location of the integrated circuit, on a given wafer, is known. For at least one embodiment, the analog identifier is determined during wafer sorting. The analog identifier for each integrated circuit can be stored in a suitable database for later use in determining the identification of an integrated circuit.

As further shown in FIG. 2, when an integrated circuit (a "subject integrated circuit") is returned for any purpose, such as in response to a qualification failure, a customer return, a test reject, or otherwise, the subject integrated circuit can undergo the same electrical test conditions used previously to measure the characteristics on which the analog identifier was based during wafer sorting or at another test time. That is, each of the Zener diodes on the subject integrated circuit can be tested and compared to the previously determined analog identifiers to identify the original wafer location of the subject integrated circuit. That is, IC Fingerprint matching can occur. As shown in FIG. 2, the "QUAL FAILURE" integrated circuit test results closely mirror the earlier recorded test results for the (35,12) integrated circuit. Such location information, granting access to any previously stored information about the integrated circuit, can then be utilized by engineers to more specifically identify one or more conditions, such as, the root cause of a defect for the given integrated circuit.

Further, it is to be appreciated that the range of reverse breakdown voltages may vary by type of Zener device utilized. Commonly, Zener diodes having reverse breakdown voltages ranging between 1 and 10 volts may be utilized. Other ranges, however, may be used for other implementations.

Further, it is to be appreciated that while the various embodiments are described herein in the context of the reverse breakdown voltage characteristics of a Zener diode, the present disclosure is not intended to be so limited. Other monotonic and stable relationships of device components may be used to collectively form an analog identifier of a given integrated circuit. For example, other diodes, resistors (e.g., high ohmic polysilicon resistors, medium ohmic polysilicon resistors, low ohmic polysilicon resistors, metal resistors, etc.), transistors (e.g., CMOS, DMOS, bipolar, etc.), or capacitors (e.g., metal insulator metal capacitor, metal oxide metal capacitor, poly oxide poly capacitor, active area capacitor, etc.) may be used as one or more identifier devices. It is to be appreciated that a collection of identifier devices may include use of devices of a same given type or of various types.

Further, it is to be appreciated that a given lot may include hundreds of thousands of integrated circuits. Each of such integrated circuits may include numerous Zener diodes to create an analog identifier. As discussed above, each Zener diode will have a reverse breakdown voltage that may slightly differ from another instance of the same Zener diode on a different integrated circuit. Accordingly, when a subject integrated circuit is to be identified, commonly known techniques for determining the correlation of results obtained across a collection of Zener diodes on the subject integrated circuit versus the results previously obtained during fabrication and sorting of the integrated circuits in the lot may be used. For at least one embodiment, the correlation coefficient may be utilized. For other embodiments, other statistical techniques may be used to determine the correlation between the subject integrated circuit and a previously identified integrated circuit. Ideally, the subject integrated circuit will have a substantially identical correlation coefficient, across the collection of Zener diodes, with a single previously identified integrated circuit. As used herein substantially identical correlation coefficient arises between an integrated circuit and a previously identified integrated circuit when the correlation coefficient equals 0.9 or higher.

Figure 3:
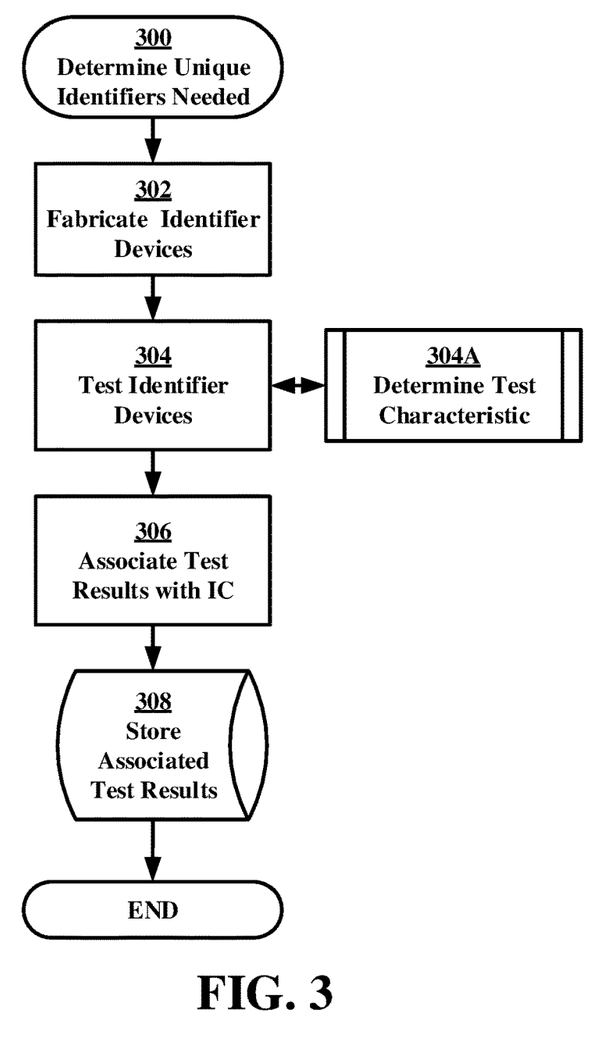
FIG. 3 is a flow chart illustrating a method for determining an analog identifier for an integrated circuit and identifying an integrated circuit based upon previously determined analog identifiers and for use in accordance with at least one embodiment of the present disclosure.

As shown in FIG. 3, a process in accordance with at least one embodiment of the present disclosure is shown for generating an analog identifier for each integrated circuit in a lot. It is to be appreciated that the present disclosure is not limited to the operations or sequencing thereof shown in FIG. 3, additional, lesser, other and/or other arrangements of process steps may be used in accordance with other embodiments of the present disclosure.

As shown, the process begins with determining a number of unique identifier data points used to distinguish each integrated circuit from other integrated circuits in the lot (Operation 300). It is to be appreciated that the number of unique identifier data points to be used to so identify may be determined based upon simulations, such as Monte Carlo simulations, trial-and-error, known practices, or otherwise and that such unique identifier data points may vary based upon other factors, such as the type of identifier device utilized to provide the unique identifiers, the accuracy realized for fabrication of such identifier devices, and otherwise. For at least one embodiment, between one and ten unique identifiers are utilized. For at least one embodiment, between ten and thirty unique identifiers are utilized. For at least one embodiment, at least twenty unique identifiers are utilized. For at least one embodiment, equal to or more than thirty unique identifiers are utilized.

Once the number of unique identifiers is determined, the process continues with fabricating the identifier devices selected to provide the unique identifiers (Operation 302). The fabricating of the identifier devices may occur at any suitable time during fabrication of each given integrated circuit and using known processes. The timing of and fabrication techniques utilized are well known and beyond the scope of the present disclosure. As discussed above, for at least one embodiment, one or more of the identifier devices are Zener diodes. For at least one embodiment, each of the identifier devices is a Zener diode. For at least one embodiment, a combination of Zener diodes and other devices are utilized to provide the desired number of unique identifiers. For other embodiments, any type of identifier device or combination of identifier devices may be utilized to provide the desired number of unique identifiers.

The process continues with testing each identifier device (Operation 304) for one or more device characteristics. As discussed above, the testing of each identifier device may arise at any given time. For at least one embodiment, testing arises during the sorting process. The testing of each identifier device may be based on any one or more desired characteristics measurable for the selected identifier device. For at least one embodiment and as shown by sub-Operation 304A, the process may include determining the one or more test characteristics to be tested for each identifier device. For at least one embodiment, the device characteristic tested includes a characteristic that is monotonic over time. For at least one embodiment, the device characteristics tested include a characteristic that is monotonic over temperature for a collection of devices. For at least one embodiment, the device characteristics tested include a characteristic that is monotonic over both time and temperature for a collection of devices. For at least one embodiment, when the identifier device is a Zener diode, the device characteristics tested include a reverse breakdown voltage for the Zener diode. For at least one embodiment, the integrated circuit configured into test mode and a multiplexer connected, directly or indirectly, to commonly available Automated Test Equipment may be utilized to test each of the identifier devices.

Per Operation 306, the test results for each of the tested identifier devices is collected and associated with the particular integrated circuit on which the identified devices are fabricated. For at least one embodiment, such association includes a mapping of the identified devices to an integrated circuit arising at a determined coordinate position, on a wafer, of a given production lot.

Per Operation 308, the associated test results are stored in a database. The test results may be stored in their native format, encrypted, compressed, or otherwise processed for storage.

Figure 4:
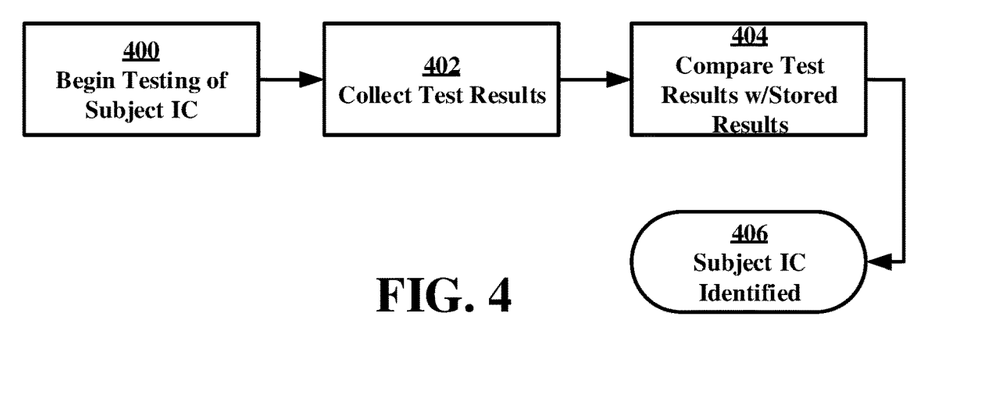
FIG. 4 is a flow chart illustrating a method for identifying an integrated circuit that has been previously marked with one or more analog identifiers in accordance with at least one embodiment of the present disclosure.

As shown in FIG. 4, a process in accordance with at least one embodiment of the present disclosure is shown for identifying an integrated circuit (the beforementioned "subject integrated circuit") that has been previously IC Fingerprinted with an analog identifier, as per an embodiment of the process of FIG. 3.

Per Operation 400, the process begins when a subject integrated circuit is received for identification. It is to be appreciated, that an integrated circuit may be received at any time arising after it has been IC Fingerprinted per the process of FIG. 3 or any other process providing for an IC Fingerprint based upon one or more device characteristics of a collection of identifier devices. For at least one embodiment, the subject integrated circuit may include a defective integrated circuit. For at least one embodiment, the subject integrated circuit may be received prior to, in conjunction with, or after having been used in one or more products. Upon receiving a subject integrated circuit, the process continues with beginning testing of the subject integrated circuit. For at least one embodiment, the subject integrated circuit is tested using each and all of the testing processes and identifying devices used in Operation 304. It is to be appreciated, however, that the testing of the subject integrated circuit may include use of one or more, and/or a subset, of the tests of the identifier devices used in Operation 304. That is, the testing of the subject integrated circuit may involve use of an iterative process with additional test and/or identifier devices being tested until those testing operations needed to identify an IC Fingerprint for a given integrated circuit are performed.

Per Operation 402, the results realized from testing of the subject integrated circuit are collected. These results may be collected in analog format, for example measured voltages, or processed and digitized per any processes used per Operation 308. For at least one embodiment, the results realized from testing of the subject integrated circuit are collected for use in comparison with the results realized from testing of the integrated circuits per Operations 306.

Per Operation 404, the results from testing of the subject integrated circuit are compared with the results stored per Operation 308. It is to be appreciated that the results stored per Operation 308 may include a very large population set. Accordingly, various data comparison and/or statistical analysis tools may be utilized per Operation 404. For at least one embodiment, Operation 404 includes the calculation and use of correlation coefficients, such as Pearson coefficients. For at least one embodiment, a correlation coefficient ranging between 0.9 and 1.0 indicates a matching has occurred between the subject integrated circuit and a previously tested integrated circuit, where such testing was previously performed as per Operations 304 and 306.

Per Operation 406, the identification of the subject integrated circuit by coordinates, wafer and lot is recorded.

Figure 5:
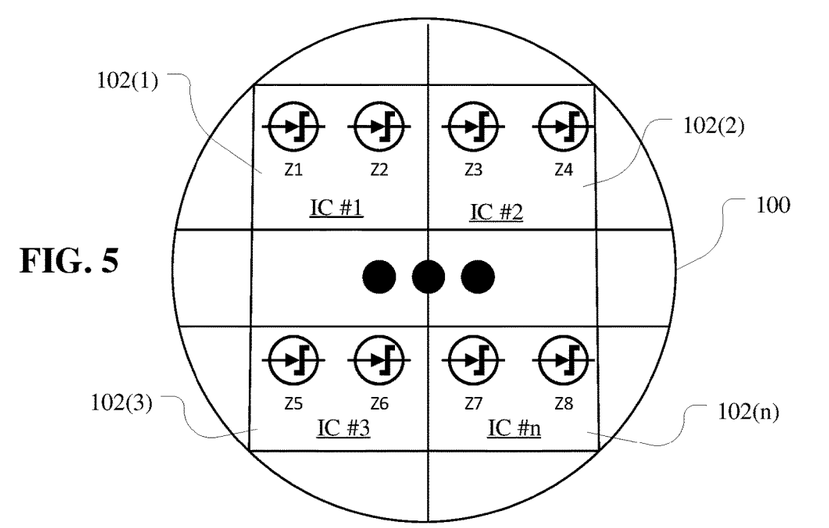
FIG. 5 is a schematic representation of a wafer having multiple integrated circuits and multiple analog identifiers and in accordance with at least one embodiment of the present disclosure.

As shown in FIG. 5, a wafer 100 may be fabricated to include multiple integrated circuits 102, such as a first integrated circuit 102(1), a second integrated circuit 102(2), a third integrated circuit 102(3) through an nth integrated circuit 102(n). The integrated circuits 102 may include, within the circuit itself or by addition, two or more analog identifiers, such as Zener diodes Z1, Z2, Z3, Z4, Z5, Z6, Z7 and Z8.

It is to be appreciated that the identification of integrated circuits during processing and later, during/after use, may be utilized for any desired purpose. As discussed above, such use may include identifying the root cause of integrated circuit defects. In other use cases, the use may include affixing an integrated circuit to an article of commerce, and using the above described processes to later affirmatively identify the origin of the article of commerce. That is, by affixing an integrated circuit to an article of commerce at or before the sale and/or use of the article of commerce, such articles of commerce can be identified at any time and information generated that is useful in preventing counterfeiting or theft, tracking products, or otherwise. Accordingly, it is to be appreciated that the above described processes and techniques for identifying integrated circuits can be applied to other uses and utilized in conjunction with any substrate, surface or otherwise in which one more identifier devices, such as Zener diodes, may be fabricated, attached or otherwise provided and reliably tested over time, temperature and/or other use case variations and/or conditions.

Although various embodiments of the claimed invention have been described above with a certain degree of particularity, or with reference to one or more individual embodiments, those skilled in the art could make numerous alterations to the disclosed embodiments without departing from the spirit or scope of the claimed invention. The use of the terms "about", "approximately" or "substantially" means that a value of an element has a parameter that is expected to be close to a stated value or position. However, as is well known in the art, there may be minor variations that prevent the values from being exactly as stated. Accordingly, anticipated variances, such as 10% differences, are reasonable variances that a person having ordinary skill in the art would expect and know are acceptable relative to a stated or ideal goal for one or more embodiments of the present disclosure. It is also to be appreciated that the terms "top" and "bottom", "left" and "right", "up" or "down", "first", "second", "before", "after", and other similar terms are used for description and ease of reference purposes only and are not intended to be limiting to any orientation or configuration of any elements or sequences of operations for the various embodiments of the present disclosure. Further, the terms "and" and "or" are not intended to be used in a limiting or expansive nature and cover any possible range of combinations of elements and operations of an embodiment of the present disclosure. Other embodiments are therefore contemplated. It is intended that all matter contained in the above description and shown in the accompanying drawings shall be interpreted as illustrative only of embodiments and not limiting. Changes in detail or structure may be made without departing from the basic elements of the invention as defined in the following claims.

What is claimed is:

1. An integrated circuit, comprising:
   a plurality of identifier devices fabricated onto the integrated circuit;
   wherein each of the plurality of identifier devices is a Zener diode, each Zener diode having a characteristic which, when tested, returns an analog test result, and the analog test result, when in a first series of analog test results, collectively forming a unique first analog identifier for the integrated circuit.

2. The integrated circuit of claim 1,
   wherein the first series of analog test results form a fingerprint for the integrated circuit.

3. The integrated circuit of claim 2,
   wherein the fingerprint is stable over time.

4. The integrated circuit of claim 1,
wherein the characteristic is a determinable property for each of the plurality of identifier devices.

5. The integrated circuit of claim 4,
wherein the determinable property monotonically varies over at least one of time and temperature.

6. The integrated circuit of claim 1,
wherein each of the plurality of identifier devices, at a first time, generate the first series of analog test results which monotonically vary from a second series of analog test results obtained from the plurality of identifier devices at a second time.

7. The integrated circuit of claim 6,
wherein the first time occurs prior to a commercial release of the integrated circuit; and
wherein the second time occurs after a commercial use of the integrated circuit.

8. The integrated circuit of claim 6,
wherein the first time occurs during at least one of a fabrication of the integrated circuit and a post-wafer cutting of a wafer onto which the integrated circuit has been fabricated.

9. The integrated circuit of claim 6,
wherein each of the first series of analog test results and the second series of analog test results are respectively obtained based on reverse breakdown voltage measurements for each of the plurality of identifier devices.

10. The integrated circuit of claim 6,
wherein the plurality of identifier devices are fabricated so as to facilitate obtaining of:
the first series of analog test results based on a first series of reverse breakdown voltage measurements for the plurality of identifier devices;
a second series of analog test results based on a second series of reverse breakdown voltage measurements for each of the plurality of identifier devices;
wherein the second series of analog test results monotonically vary over time and temperature versus the first series of analog test results; and
wherein a correlation between the first series of analog test results and the second series of analog test results facilitate identification of the integrated circuit.

11. An integrated circuit comprising:
a collection of two or more "n" identifier devices fabricated onto the integrated circuit;
wherein each of the collection of two or more "n" identifier devices is a Zener diode; and
wherein each of the Zener diodes have a characteristic which, when tested, returns an analog test result that, in a series of analog test results for the collection of two or more "n" identifier devices, collectively and uniquely identify the integrated circuit.

12. The integrated circuit of claim 11,
wherein "n" is a number of identifier devices needed to provide die level traceability for the integrated circuit.

13. The integrated circuit of claim 11,
wherein the collection of two or more "n" identifier devices utilize less than one percent (1%) of a substrate used in forming the integrated circuit.

14. The integrated circuit of claim 11,
wherein each of the collection of two or more "n" identifier devices has at least one property that monotonically varies over at least one of time and temperature.

15. An integrated circuit comprising:
a collection of devices fabricated onto the integrated circuit;
wherein each of the collection of devices are Zener diodes that return a test result and,
the collection of devices provide a collection of first test results which form an analog fingerprint for the integrated circuit; and
wherein die level traceability for the integrated circuit is facilitated by a correlation of the collection of first test results with a collection of second test results obtained after use of the integrated circuit.

16. The integrated circuit of claim 15,
wherein the collection of second test results monotonically vary over time and temperature versus the collection of first test results.

17. The integrated circuit of claim 15,
wherein the collection of devices occupy an insubstantial area of the integrated circuit.

18. The integrated circuit of claim 15,
wherein the collection of first test results are based upon a determinable property for each of the collection of devices.

19. The integrated circuit of claim 15,
wherein the collection of devices arise in the integrated circuit.

* * * * *